INVENTORS.
JOHN E. MAYNARD
ORRAL W. RITCHEY
BY
Reynolds, Beach & Christensen
ATTORNEYS INVENTORS.
JOHN E. MAYNARD
ORRAL W. RITCHEY
BY
Reynolds, Beach & Christensen
ATTORNEYS INVENTORS.
JOHN E. MAYNARD
ORRAL W. RITCHEY
BY
Reynolds, Beach & Christensen
ATTORNEYS 2,808,474

VARIABLE ATTENUATION CONTROL CIRCUITS

John E. Maynard, Mercer Island, and Orral W. Ritchey, Seattle, Wash., assignors to Boeing Airplane Company, Seattle, Wash., a corporation of Delaware Application January 23, 1956, Serial No. 560,677

11 Claims. (Cl. 179—171)

This invention relates to circuit apparatus employing a novel arrangement for variably attenuating electrical signals and in its preferred application specifically comprises an essential part of a novel automatic gain-controlled amplifier circuit. The invention is herein illustratively described by reference to its presently preferred form; however, it will be recognized that various changes and modifications therein may be made without departing from the essential and characterizing features involved.

In the usual automatic gain-controlled amplifier circuit, the amplified output signals are detected and the resulting direct voltage is applied to a gain control element of one or more stages in the amplifier in order to vary the gain thereof in a manner suppressing output signal intensity variations. Such a technique, while generally satisfactory for wide-band or low-frequency amplifiers, presents problems in the case of narrow-band circuits, especially those operating at relatively high frequencies. These problems are severe in the case of transistor amplifiers. In a transistor amplifier variations of emitter current to control transistor gain have a marked effect on the shape of the response curve of the amplifier. Also the resulting variation in amplifier input impedance as a function of varying gain control current applied to the transistor produces a variation in the Q of the input circuit and shifts the center frequency of the response curve. In addition, the application of automatic gain control voltage or current to the controlled transistor stage imposes an upper limit on the absolute voltage that can be applied to the input terminals of the circuit. A typical circuit in which these problems become serious when transistor amplifiers are used is found in transistor intermediate-frequency amplifiers operating at high frequencies in the range of a few megacycles.

A general object of the present invention is an improved automatic gain control circuit for amplifiers overcoming the foregoing described problems. While the present invention was developed primarily for transistor circuits, it will be recognized that the novel principles involved apply also to other forms of circuits and amplifiers, including vacuum tube amplifiers.

Another object of the invention is a novel variable attenuation circuit having application to gain control of amplifiers and other uses including signal modulation and signal attenuation.

Another object of the invention is a novel attenuation circuit of the bridge type controlled variably by applied voltage or current in order to subject input signals to attenuation which is substantially proportional to the applied control voltage or current.

Still another object of the invention is an effective and reliable variable attenuation circuit having substantially constant input and output impedances throughout its range of operation.

As herein disclosed, the novel automatic gain-controlled amplifier comprises a variable attenuation circuit interposed in the path of signals passing into or through the amplifier and controlled by detected amplifier output voltage to suppress variations in amplifier output signal intensity. The novel variable attenuation circuit therein comprises two bridge-connected variable impedance elements, preferably in the form of unidirectionally conductive elements, connected in parallel relationship and with relative opposite polarity between the attenuation circuit input and output. Such circuit further includes phase inversion means in the connections between one such element and said circuit input and output, whereby the input signal reaches said circuit output, hence the amplifier input, through said parallel-connected elements with relatively opposite phasing. An important feature of the circuit resides in the provision of a source of variable control bias, such as the output of an automatic gain control detector energized by the output of the amplifier, applied to both unidirectionally conductive elements, and means biasing one of said elements to a low state of conduction initially whereby a progressive change in amplifier output causes such element to become increasingly more conductive and the other element increasingly less conductive. In accordance with another feature, normal or initial operating points of the respective unidirectionally conductive elements are so selected that the progressive change in their conductivities occurs in such a manner that the effective circuit input and output impedances remain substantially constant throughout the range of control voltage variation, thereby avoiding undesirable shifts in the amplifier response curve center frequency or change in shape of the over-all circuit response characteristic.

In accordance with another feature of the automatic gain-controlled amplifier circuit the detector means in the amplifier output includes means automatically limiting the control bias voltage variation at a value which establishes substantial equality between the conductivity of the two elements when amplified signal strength reaches a predetermined maximum, thereby avoiding regenerative effects in the automatic gain control loop should said maximum be exceeded.

These and other features, objects and advantages of the invention, together with certain details of the preferred forms thereof will become more fully evident from the following description by reference to the accompanying drawings.

Figure 3:
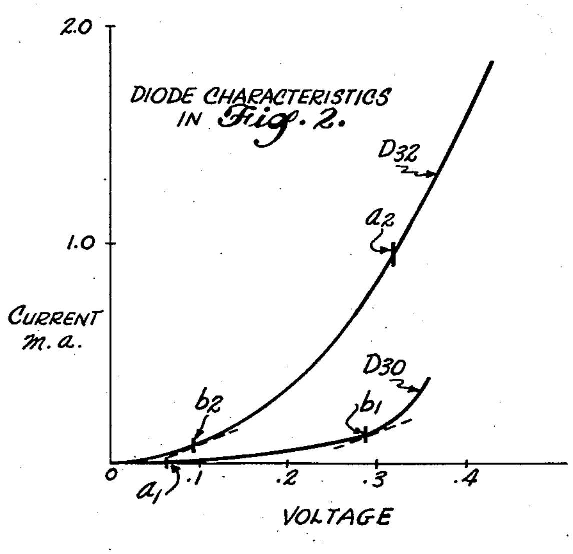
Figure 3 is a graph showing typical optimum characteristic curves for the two rectifier elements in Figure 2, together with certain features of these characteristics entering into the operation of a circuit of optimum form represented by Figure 2.
Figure 3A:
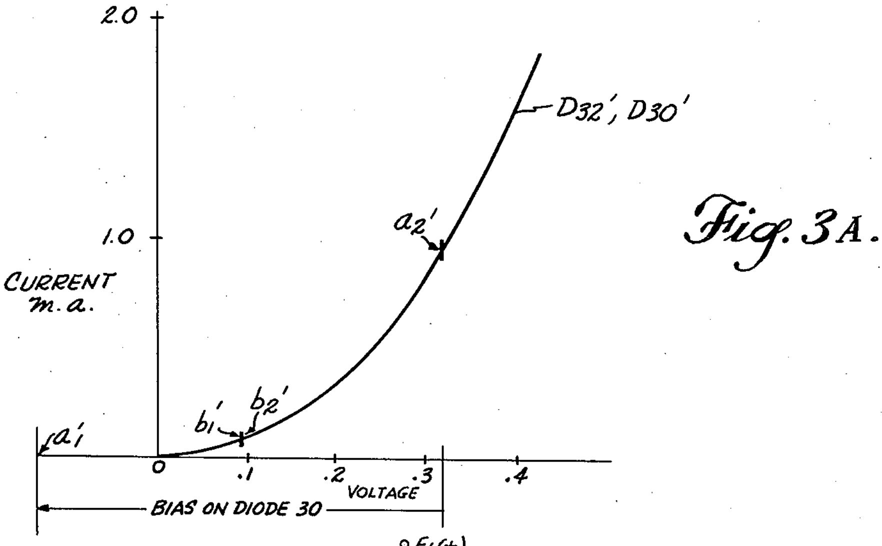

Figure 3*a* is a graph illustrating the characteristic curve of identical rectifier elements used in a practical version of the circuit of Figure 3, together with the manner of operating such elements therein.

Figure 2:
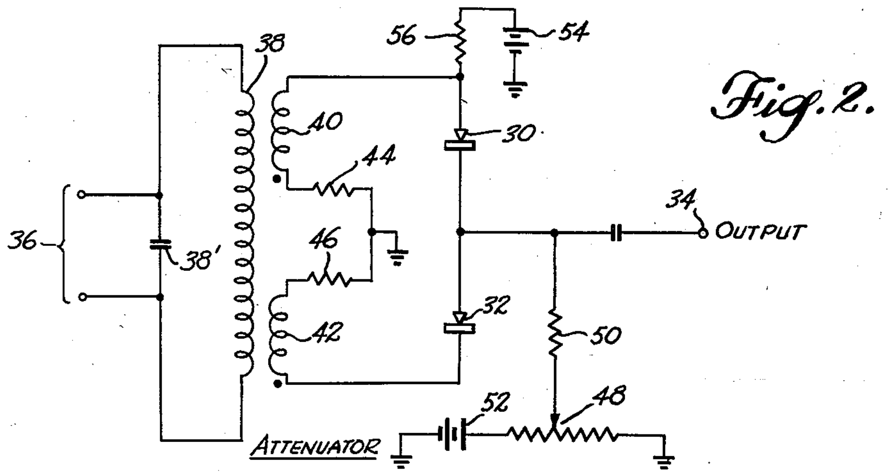
Figure 2 is a schematic diagram of such circuit as a controlled attenuator.
Figure 4:
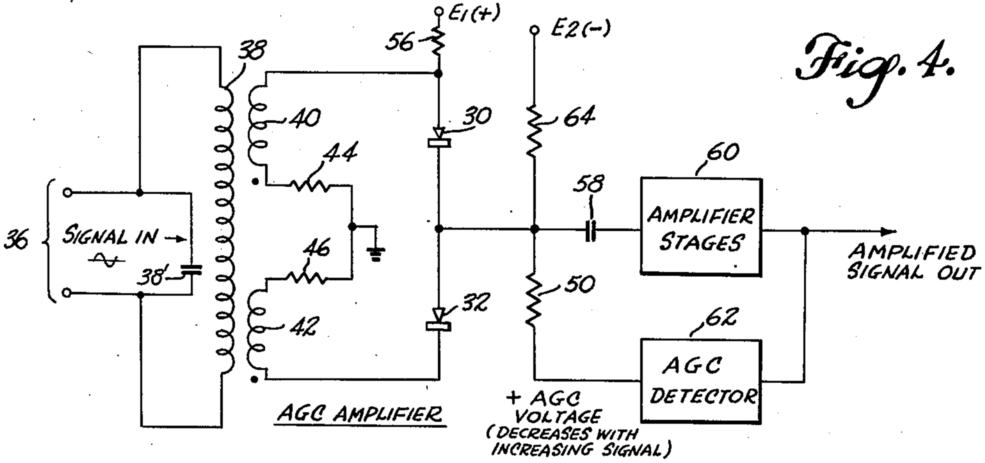

Figure 4 is a partially schematic and partially block diagram illustration of a novel automatic gain-controlled amplifier incorporating the variable attenuation control circuit of Figure 2.

Figure 5:
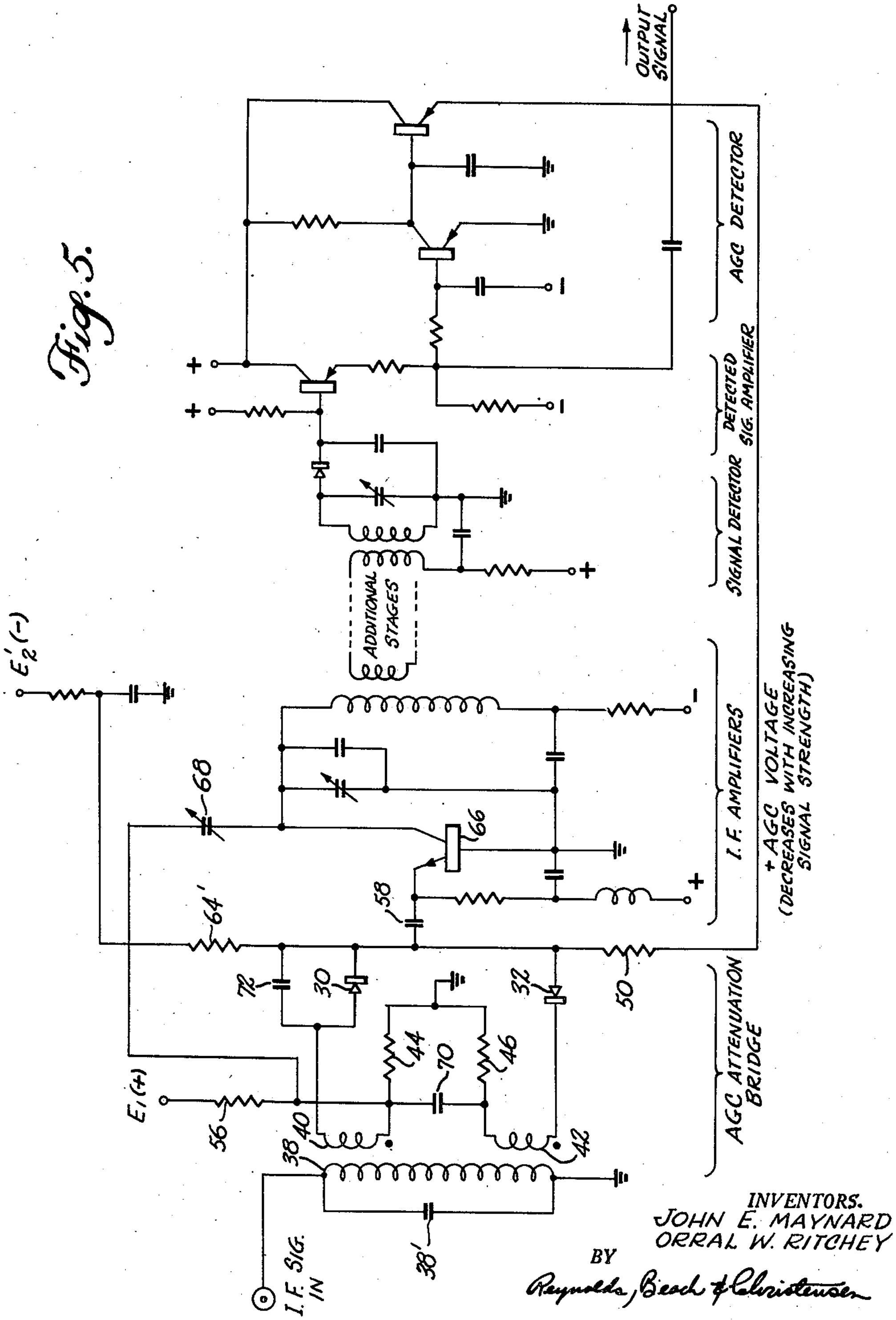

Figure 5 is a detailed circuit diagram of such automatic gain-controlled amplifier using transistors.

Figure 6:
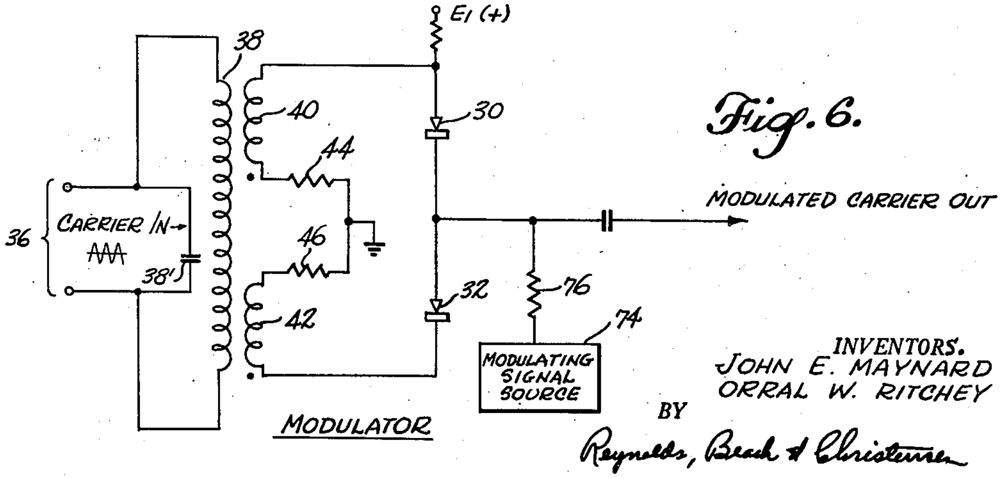

Figure 6 is a schematic diagram showing the variable attenuation control circuit as a modulator.

Figure 1:
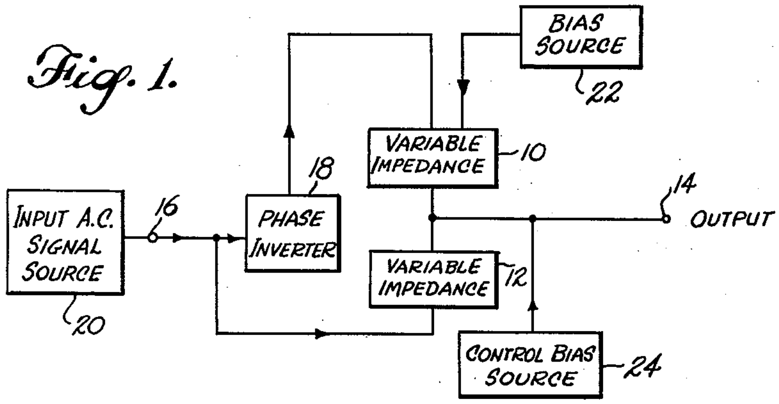
Figure 1 is a simplified block diagram of the novel variable attenuation control circuit.

With reference to Figure 1 the novel variable attenuation control circuit arrangement comprises the two variable impedance elements 10 and 12 connected in parallel relationship between the output at 14 and the input at 16. A phase inverter 18 is interposed in the connections between one of the variable impedance elements such as the element 10 and said input and output, whereby the alternating current signals from the input signal source 20 connected to input 16 reach the output 14 through the variable impedance elements with respectively opposite phasing. As a result, depending upon the relative impedances of such elements, the signal passing through one such element partially or completely nullifies or cancels out the signal passing through the other such element. A bias source 22 is connected to one of the elements such as the element 10 to establish the impedance value thereof normally at a materially higher value than the normal impedance value of the other element 12. A control bias source 24 is connected to both variable impedance elements and is operable to vary the net bias on such elements from an initial value producing the above-described impedance relationship toward a final value producing equality of impedance of the elements. As a result, because of increasing mutual cancellation of the signal flowing through the parallel paths to the output 14 the attenuation imposed by the circuit upon input signals being transmitted to such output is caused to increase progressively from an initial value to a maximum with progressive change of control bias voltage from said initial value to said final value.

As shown in Figure 2 the preferred implementation of the variable impedance elements of Figure 1 comprises non-linear unidirectionally conductive elements such as rectifiers 30 and 32. Such rectifiers are connected with relatively opposite polarity between the output at 34 and the input at 36. A transformer primary 38, tuned by condenser 38′, is connected to the input terminals 36 and has similar secondaries 40 and 42, with which it has unity coupling in the example, hence neither secondary need be tuned. One end of secondary 40 is connected to ground through a resistance 44, whereas the opposite end (in terms of relative polarity) of secondary 42 is connected to ground through the similar resistance 46. The other end of secondary 40 is connected to the side of rectifier 30 opposite from the output 34 whereas the other end of secondary 42 is similarly connected to the side of rectifier 32 opposite from the output 34.

A source of control bias comprises the potentiometer 48 having its wiper connected through resistance 50 to the junction between the rectifiers. The winding of potentiometer 48 is connected between a positive voltage source 52 and ground. The polarity of the connections to rectifier 32 is such that the positive potential appearing at the wiper of this potentiometer normally produces a substantial flow of current through rectifier 32, the path of flow including the resistance 50, the rectifier, the winding 42 and resistances 46. The junction between rectifier 30 and winding 40 is connected to a second bias source 54 which applies positive potential to such junction through resistance 56. The magnitude of the bias potential from source 54 is such that rectifier 30 is rendered only slightly conductive.

As a result of the relative rectifier biases normally established by the sources 54 and 52, 48 incoming alternating current signals applied to terminals 36 are transmitted readily through rectifier 32 and only slightly or not at all through rectifier 30. This may be observed from Figure 3 wherein D32 is the characteristic curve of rectifier 32 whereas D30 is the characteristic curve of rectifier 30. The selection of biases in a typical case may be such that rectifier 32 is normally biased to the operating point $a_2$ on its characteristic, whereas rectifier 30 is normally biased to the operating point $a_1$ on its characteristic. It will be seen that the slope of the curve D32 at point $a_2$ is materially greater than the slope of the curve D30 at the point $a_1$; hence, under these normal bias conditions the alternating current signal through rectifier 32 reaches output 34 with relatively little cancellation by the signal of opposite phase passing through rectifier 30. However, by shifting the position of the wiper of potentiometer 48 to apply a progressively decreasing positive voltage to the junction between rectifiers 30 and 32, rectifier 30 is rendered more conductive and rectifier 32 is rendered progressively less conductive. The progressive decrease of positive bias applied to the junction between these rectifiers may be continued until the signal current through rectifier 30 becomes substantially equal to that through rectifier 32, as represented by the points $b_1$ and $b_2$ on the characteristic curves D30 and D32 respectively. This represents the condition of maximum attenuation of the circuit.

A highly important inherent effect of the constant bias source 54, which establishes the normal bias differential between the rectifiers is that of mutually offsetting the characteristic curves of the two rectifiers as a function of applied control bias from the control bias source 48, 52. Moreover, the initial setting of the potentiometer 48 should establish a certain normal bias on the rectifier 32. The two biases are so selected and the characteristic curves of the respective rectifiers are so chosen in the optimum case that the total power dissipated in the attenuation network between the output 34 and the circuit input 36 remains substantially constant throughout variations in resistance of the diodes caused by changes in control bias applied by potentiometer 48. This selection of characteristic curves, normal bias and the control range of the circuit as an attenuator are analytically or experimentally determinable by techniques well known in the art.

For example one suitable method of approach is to select a suitable diode such as a 1N34 for rectifier 32 and then calculate the required optimum characteristic for the rectifier 30 on the assumption that the limiting value of the control bias will produce equal conductivity in the two rectifiers and that for all values of such control bias between such limiting value and an opposite limit wherein rectifier 32 conducts relatively heavily and rectifier 30 conducts relatively lightly or not at all the signal power dissipation in the circuit must remain substantially constant.

The power equation is expressable as follows:

$$P_0=\frac{e_0^2(R_{32}+R_{30}+4R_L)}{R_{30}R_{32}+R_{32}R_L+R_{30}R_L}$$

where:

$P_0$=dissipated power $e_0$=applied signal intensity in each rectifier branch of circuit $R_{32}$=dynamic resistance of rectifier 32

$R_{30}$=dynamic resistance of rectifier 30

$R_L$=load resistance (not shown in Fig. 2) imposed on attenuation circuit $R_1$ as a function of $R_2$ may next be calculated by assuming that $R_{30}$ is permitted to go to infinity under which condition $R_{32}$ has its minimum selected resistance $r_d$, thus:

$$R_{32}R_{30}-R_{32}r_d-R_{30}r_d=4R_L(r_d+R_L) \qquad \text{(A)}$$

By next writing the expression for current in preselected rectifier 32, $$i_{32}=(\alpha e_{32}+\beta e_{32}^2+\gamma e_{32}^3)10^{-3}$$

where $\alpha$, $\beta$ and $\gamma$ are constants, and $i_{32}$ is the current in and $e_{32}$ is the voltage across rectifier 32, it is next possible to determine the resistance of this rectifier as a function of voltage thereacross $$R_{32}=\frac{de_{32}}{di_{32}}=\frac{1}{(\alpha+2\beta e_{32}+3\gamma e_{32}^2)10^{-3}} \qquad \text{(B)}$$

then solve for $R_{30}$ in Equation A by substituting therein the value of $R_{32}$ expressed in B, wherefrom $di_{30}$ may be calculated. Now assuming $e_{32}=V_0-e_{30}$, where $V_0$ is a constant, $i_{30}$ may be calculated by integrating the resulting expression for $di_{30}$. In Figure 3 curve $D_{32}$ is the curve of an 1N34 whereas $D_{32}$ is the optimum curve of a matching rectifier satisfying the above conditions.

By proper methods of selection or design of diodes it is possible to obtain actual diodes 30 which will "match" those used for diodes 32 as set forth above, so as to obtain the desired constant power dissipation in the attenuation circuit as a function of variable voltage applied by potentiometer 48.

It has been found that even with diodes of identical characteristic it is still readily possible to approximate the optimum results set forth above if the final operating point at which the two diodes conduct equally is properly established by the initial net biases on the rectifiers 30 and 32. Since both rectifiers change net bias at the same rate as potentiometer 48 is progressively varied in its setting, the initial value of both biases (i. e. voltage of source 54 and normal or initial setting of potentiometer 58) determines the place on the common characteristic curve at which the rectifiers conduct equally. In general this point is selected approximately as the location of sharpest bend in the curve. Thus as the applied control bias from potentiometer 48 is progressively decreased from its normal positive value the initial rate of change in the resistance of rectifier 32 is small, since the slope of the characteristic curve remains fairly constant. During this same initial portion of the variation in potentiometer output voltage rectifier 30 remains biased beyond cut-off, hence its resistance does not change at all. However, the total signal power dissipation in the attenuation circuit does not vary appreciably during this initial phase of variation of potentiometer output, since the effective resistances of the two rectifiers remain approximately the same. But as the sharper portion of the curve is approached by continuing the change of bias on rectifier 32, the resistance of this rectifier increases at an appreciable and increasing rate. At the same time, however, rectifier 30 has entered the region of conductivity and is also approaching the more sharply curved portion of the characteristic so that its dynamic resistance increases appreciably and at an increasing rate. It is found, under these conditions, with the curve of an 1N34 and other standard rectifiers, the combined varying resistances of the two rectifiers still have the effect of maintaining substantially constant power dissipation in the attenuation network at least to a first order of approximation satisfactory for most practical purposes. As a result, the center frequency and the response curve of the network remains substantially constant throughout variations in the setting of potentiometer 48 as desired.

In Figure 4 the variable attenuation control circuit is applied in an automatic gain-controlled amplifier. The junction between rectifiers 30 and 32 is connected through coupling condenser 58 to the input of the amplifier stage or stages 60. Such junction is coupled through resistance 50 to the output of an automatic gain control detector 62 energized by the output signals from amplifier 60, as shown. A positive AGC direct voltage is applied by the detector 62 to the junction between the rectifiers, which voltage varies in accordance with variations in the amplifier output signal intensity from the amplifier stages. The rectifier junction is also connected to a separate bias source E2 through a resistance 64 in order to establish the normal or initial value of control bias at the rectifier junction at the required value. The bias voltage E2 is negative. The source of bias for the rectifier 30 is designated E1 and comprises a positive voltage source representing the source 54 in Figure 2.

In the operation of the circuit shown in Figure 4 rectifier 32 is biased to conduct relatively heavily, whereas rectifier 30 is biased to conduct very little or not at all with minimum signal amplitude applied to the input terminals 36. As signal amplitude increases into the control range of the attenuator circuit there will be an increase in the output from the amplifier stages 60, producing a decrease in the positive AGC voltage developed at the output of detector 62. This causes a decrease in the conduction in rectifier 32 and application of decreasing bias to rectifier 30 tending to render the latter more conductive, with the result that the combined resistances of the rectifier to passage of signal through the attenuation circuit is increased in opposition to the increasing signal amplitude. Therefore, a wide variation in amplitude of the input signal applied to terminals 36 can produce only a slight change in the output of the amplifier. Only a small variation of amplified output voltage is required to swing the attenuator network through its full range of control, thereby insuring close regulation of amplifier output signal intensity.

In Figure 5 the gain-controlled amplifier shown in Figure 4 is depicted in schematic form as applied to transistor amplifiers and detectors. Like parts bear similar reference numerals to those previously illustrated and described. The circuit represents a high-frequency intermediate-frequency amplifier such as may be used in ultra high-frequency communications apparatus. The output from the AGC attenuation bridge circuit is applied through coupling condenser 58 through the input or emitter electrode of the first stage of I. F. amplification, which stage is succeeded by additional stages of a similar type, if desired, each tuned to the same I. F. frequency, and the last stage coupled to the signal detector. The output of the signal detector is amplified in the detected signal amplifier, and is delivered from the circuit as the desired output signal. Also such output is applied to the AGC detector consisting of the two-stage transistor detector-amplifier, producing a positive output direct voltage designated the AGC voltage in the figure. This voltage is applied through resistance 50 to the diode junction and decreases in magnitude with increasing amplifier output signal intensity.

The design details of the I. F. amplifiers, signal detector, detected signal amplifier and AGC detector follow conventional transistor circuit practices and require no detailed description herein. However, it will be noted that neutralization of the transistor 66 in the first I. F. amplifier stage is accomplished by feed-back from the collector of this transistor through the coupling condenser 68 to the ends of transformer secondaries 40 and 42 which are respectively opposite from those connected to their associated rectifiers 30 and 32. A condenser 70 interconnecting the first-mentioned ends of these secondaries insures that for neutralization purposes they are connected together, whereas they are isolated from each other for purposes of direct voltages in the circuit. A condenser 72 is shunted across rectifier 30 in order to permit the attenuation bridge circuit to be balanced for substantially complete cancellation of increases in signal intensity reaching the emitter of transistor 66 when the rectifiers have reached the point of substantially equal conduction, i. e. the upper limit of output signal intensity in the range of operation of the attenuation circuit. This upper limit is established by designing the transistor AGC detector so that one or both stages saturate at that upper value of amplified signal amplitude. Consequently the condition of rectifier 30 conducting more heavily than rectifier 32 and causing regeneration in the AGC loop cannot occur.

Figure 6 illustrates application of the variable attenuation control circuit in a modulator. In this case a carrier signal at the desired frequency is applied to input terminals 36 and the desired modulating signal from a source 74 is applied through resistance 76 to the junction between the rectifiers 30 and 32. The modulating signal source may be an audio amplifier, for example, fed by a suitable source of audio signals, whereas the carrier frequency applied to input terminals 36 may be a radio frequency carrier, with the result that the modulated carrier output may represent the signal applied to the final transmitter amplifier stages in a radio broadcasting station, or the like. As long as the signals produced by the modulating signal source 74 are within the range of operation of the circuit, the variable attenuation produced by the diode bridge comprising rectifiers 30 and 32 will have the desired modulation effect.

We claim as our invention:

1. A variable attenuation control circuit comprising an output, an input, first and second variable impedance elements subject to impedance variation following a generally similar characteristic in response to variations in bias applied thereto, each of said variable impedance elements having one side connected to said output, input circuit means connecting the other side of said first variable impedance element to said input and transmitting alternating input signals with one phasing through said first element to said output, further input circuit means connecting the other side of said second variable impedance element to said input and transmitting alternating input signals with relatively opposite phasing through said second element to said output, a bias source connected to one of said elements and subjecting said one element to a normal bias differing materially from that of the other element whereby the impedances of such elements normally differ materially from each other, and a control source connected to both of said variable impedance elements and applying to said elements impedance control bias subject to variation throughout a range from a normal value to a materially different value for progressively varying the net bias of said variable impedance elements toward equality, whereby the attenuation of input signal transmitted to said output is varied in accordance with said control bias.

2. The variable attenuation control circuit defined in claim 1, wherein the normal net biases applied to the respective variable impedance element are established at relative values whereby the decrease in power dissipation caused by increasing impedance of the normally more conductive element approximately equals the accompanying increase in power dissipation caused by decreasing impedance of the normally less conductive element during change of the control bias from its normal value to the materially different value.

3. The variable attenuation circuit defined in claim 2, wherein the first and second variable impedance elements comprise rectifiers connected with relatively opposite polarity between the output and the input.

4. The variable attenuation circuit defined in claim 1, wherein the first and second variable impedance elements comprise rectifiers connected with relatively opposite polarity between the output and the input.

5. In combination, an input transformer having a primary subject to alternating input signals, and two secondaries, an output, first and second unidirectionally conductive elements having generally similar non-linear voltage-current characteristics, means connecting said first and second elements in parallel relationship with relatively opposite polarity between said output and the respective transformer secondaries, with the connections of said secondaries having relatively opposite polarity, whereby the input signal reaches said output through said elements with relatively opposite phasing, means normally biasing said elements relatively whereby one is rendered materially more conductive than the other, and a source of variable control bias connected to both of said elements with relatively opposite polarity, whereby the normally more conductive element is rendered progressively less conductive while the other element is rendered correspondingly more conductive in response to a progressive change of said variable bias from a normal value to a materially different value.

6. Automatic gain-controlled amplifier circuit means comprising, in combination, amplifier means having an amplifier input and an amplifier output, detector means connected to said amplifier output and producing an impedance control bias direct voltage which progressively changes from an initial value to a final value in response to an increase of amplifier output signal from a predetermined lower value to a predetermined upper value, a circuit input, first and second voltage-controlled variable impedance elements subject to impedance variation following a generally similar characteristic in response to variations in bias voltage applied thereto, each of said variable impedance elements having one side connected to said amplifier input, means connecting the other side of said first variable impedance element to said circuit input and transmitting alternating input signals with one phasing through said first element to said amplifier input, means connecting the other side of said second variable impedance element to said circuit input and transmitting alternating input signals with relatively opposite phasing through said second element to said amplifier input, a bias source connected to one of said elements and subjecting said one element to a normal bias differing materially from that of the other element whereby the impedances of such elements normally differ materially from each other, and means connecting said detector means to both of said variable impedance elements and applying thereto impedance control bias voltage for progressively varying the net bias of said variable impedance elements toward equality as said control bias voltage varies from said initial value to said final value thereof, whereby the attenuation of input signal transmitted to said amplifier input is progressively increased with progressive increase of input signal strength.

7. The automatic gain-controlled amplifier circuit defined in claim 6, wherein the detector means includes means automatically limiting the change of control bias voltage therefrom at a final value which substantially equalizes the net bias applied to the elements.

8. The combination defined in claim 7, wherein the voltage-current characteristics of said elements have relatively straight portions joined by a relatively sharply curved portion and wherein the respective normal biases on such elements establish their normal operating points such that progressive change of the control bias from its normal value causes the operating points of such elements to approach equality in the sharply curved portion of said characteristic.

9. The circuit means defined in claim 6, wherein the amplifier means comprises a narrow-band amplifier wherein the variable impedance elements comprise unidirectionally conductive elements having generally similar nonlinear voltage-current characteristics and each having opposite electrodes, one electrode of one such element being connected to the amplifier input and the relatively opposite electrode of the other such element being connected to such amplifier input.

10. In combination, an output, first and second unidirectionally conductive elements having generally similar nonlinear voltage-current characteristics, a first source of alternating voltage, means connecting said first element with one polarity between said source and said output, a second source of alternating voltage oppositely phased from said first source, means connecting said second element, with polarity relatively opposite that of said first element, between said second source and said output, a source of variable control bias connected to one side of each of said elements with relatively opposite polarity, means connected to the opposite side of one of said elements to render one such element normally materially more conductive than the other, said variable control bias source being adapted for adjustment whereby the normally more conductive element is rendered progressively less conductive while the other element is rendered correspondingly more conductive in response to a progressive change of said variable bias from a normal value to a materially different value.

11. The combination defined in claim 10, wherein the voltage-current characteristics of said elements have relatively straight portions joined by a relatively sharply curved portion and wherein the respective normal biases on such elements establish their normal operating points such that progressive change of the control bias from its normal value causes the operating points of such elements to approach equality in the sharply curved portion of said characteristic.

References Cited in the file of this patent

UNITED STATES PATENTS

| | | |
|---|---|---|
| 2,085,905 | Friedrich | July 6, 1937 |
| 2,098,370 | Bartels | Nov. 9, 1937 |
| 2,279,128 | Pasley | Apr. 17, 1942 |
| 2,557,009 | Purington | June 12, 1951 |
| 2,663,002 | McManis et al. | Dec. 15, 1953 |